United States Patent [19]
Silve et al.

[11] Patent Number: 6,113,647
[45] Date of Patent: Sep. 5, 2000

[54] COMPUTER AIDED DESIGN SYSTEM AND METHOD USING HIERARCHICAL AND FLAT NETLIST CIRCUIT REPRESENTATIONS

[75] Inventors: Francois Silve, Lecannet; Arnold Ginetti, Antibos, both of France

[73] Assignee: VLSI Technology, Inc., San Jose, Calif.

[21] Appl. No.: 08/746,080

[22] Filed: Nov. 6, 1996

[51] Int. Cl.[7] .................................................. G06F 15/60
[52] U.S. Cl. .................................................. 716/11; 716/2
[58] Field of Search .................................. 364/488, 489, 364/490, 491; 716/2

[56] References Cited

U.S. PATENT DOCUMENTS

| | | | |
|---|---|---|---|
| 5,249,133 | 9/1993 | Batra | 364/489 |
| 5,519,627 | 5/1996 | Mahmood et al. | 364/488 |
| 5,610,832 | 3/1997 | Wikle et al. | 364/491 |

*Primary Examiner*—Paul R. Lintz
*Assistant Examiner*—Thuan Do
*Attorney, Agent, or Firm*—Pennie & Edmonds LLP

[57] ABSTRACT

A set of flat net descriptors are added to a hierarchical representation of a specified circuit design so as to provide a hierarchical view and a flat net view of the circuit design. The hierarchical representation includes a set of cell descriptors representing hierarchical cells in the specified circuit design, and a set of net descriptors representing portions of interconnections located within each hierarchical cell. Each net descriptor has associated therewith a list of endpoint descriptors representing endpoints of a corresponding one of the interconnections located within a respective hierarchical cell. The procedure for generating flat nets generates a flat net descriptor for each interconnection in the specified circuit. Each flat net descriptor has associated therewith a list of endpoint descriptors representing all endpoints of the interconnection. Each of the endpoint descriptor associated with a flat net descriptor represents an interconnection endpoint in a flat, top level circuit representation of the specified circuit design. A flat net pointer is added to each net descriptor in the hierarchical representation of the specified circuit design. The flat net pointer points to an associated one of the flat net descriptors. As a result, a flat net representation of any interconnection in the specified circuit design is accessible through the flat net pointer in each of the net descriptors representing the interconnection.

8 Claims, 5 Drawing Sheets

COMPUTER AIDED DESIGN SYSTEM AND METHOD USING HIERARCHICAL AND FLAT NETLIST CIRCUIT REPRESENTATIONS

The present invention relates generally to computer aided design systems for designing and optimizing electrical circuits, and particularly to a system and method for maintaining and providing access both a hierarchical netlist representation and a flat netlist representation of a specified electrical circuit.

BACKGROUND OF THE INVENTION

Electronic circuit designs are usually stored in memory in computer aided design (CAD) systems in a hierarchical form, or in a flat form. Some CAD tools (e.g., logic optimization, and hierarchical cell simulation tools) typically use or require the hierarchical representation of a circuit design. Tools that modify circuit designs (such as compilers) will leave the hierarchy unchanged so that the user can easily find and check what has been done. Other CAD tools (e.g., timing verification, circuit simulation, and circuit placement and routing tools) typically use or require a flat representation of a circuit design. In a timing verifier, which computes the time required for a signal to go from one interconnection to another through a list of gates and interconnections, the circuit design hierarchy does not carry any useful information.

Increasingly, CAD tools are being linked together (e.g., circuit synthesizers, circuit layout tools, and timing verifiers) and must work on the data structure representations of circuit designs. As a result, there is a need to provide circuit representation data structures that provide both a hierarchical view and a flat view of a circuit design at the same time.

SUMMARY OF THE INVENTION

In summary, a set of flat net descriptors are added to a hierarchical representation of a specified circuit design so as to provide a hierarchical view and a flat net view of the circuit design. The hierarchical representation includes a set of cell descriptors representing hierarchical cells in the specified circuit design, and a set of net descriptors representing portions of interconnections located within each hierarchical cell. Each net descriptor has associated therewith a list of endpoint descriptors representing endpoints of a corresponding one of the interconnections located within a respective hierarchical cell.

The procedure for generating flat nets generates a flat net descriptor for each interconnection in the specified circuit. Each flat net descriptor has associated therewith a list of endpoint descriptors representing all endpoints of the interconnection. Each of the endpoint descriptor associated with a flat net descriptor represents an interconnection endpoint in a flat, top level circuit representation of the specified circuit design.

A flat net pointer is added to each net descriptor in the hierarchical representation of the specified circuit design. The flat net pointer points to an associated one of the flat net descriptors. As a result, a flat net representation of any interconnection in the specified circuit design is accessible through the flat net pointer in each of the net descriptors representing the interconnection.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
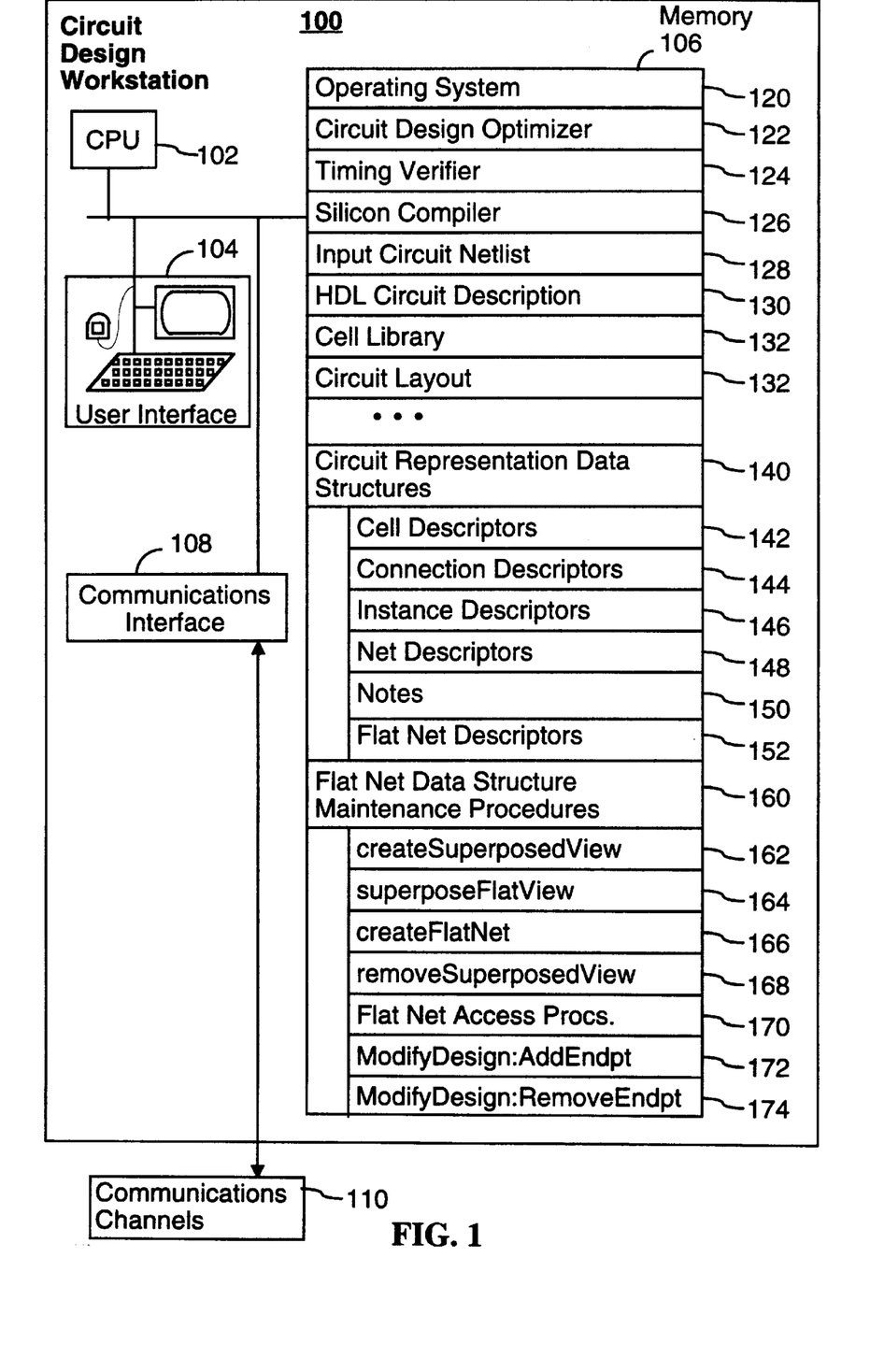
FIG. 1 depicts a computer system incorporating the present invention.

Referring to FIG. 1, a computer system 100 incorporating the present invention will typically include a central processing unit 102, a user interface 104, memory 106, and a communications interface 108 for transferring information to and from other devices via one or more communication channels 110.

Memory 106 stores both computer software and data, including:

- an operating system 120;
- a number of CAD software tools, including a circuit design optimizer 122, a timing verifier 124, and a silicon compiler 126;
- input data submitted by users of the system, including input circuit netlists 128 and/or HDL circuit descriptions 130;
- a cell library 132 for defining the functions and other characteristics of predefined circuit cells available for use in circuit designs;
- output files, such as circuit layouts 134;
- internally maintained circuit representation data structures 140 for storing circuit designs using both hierarchical and flat representations; and
- a set of flat net data structure maintenance procedures 160.

The circuit representation data structures 140, which will be described in more detail below, include:

- cell descriptors 142;
- connection descriptors 144;
- instance descriptors 146;
- net descriptors 148; and
- flat net descriptors 152.

The flat net data structure maintenance procedures 160, which will be described in more detail below, include:

- createSuperposedView 162;
- superposeFlatView 164;
- createFlatNet 166;
- removeSuperposedView 168;
- flat net access procedures 170;
- ModifyDesign:AddEndPt 172; and
- ModifyDesign:RemoveEndPt 174.

Circuit designs typically include two types of elements: interconnections and gates. Interconnections are wires, which carry signals to their endpoints. The endpoints have the same electrical value at any time, if signal propagation along the wire is ignored. Gates are operators that receive signals and then generate other signals. Each gate behaves according to a predefined functionality.

Each circuit item (i.e., interconnection or gate) is associated with a descriptor (stored in computer memory 106) that contains the information about its connections with other items. A cell library 132 contains a set of predefined cells, each of which represents a type of gate and its associated functionality.

Figure 4:
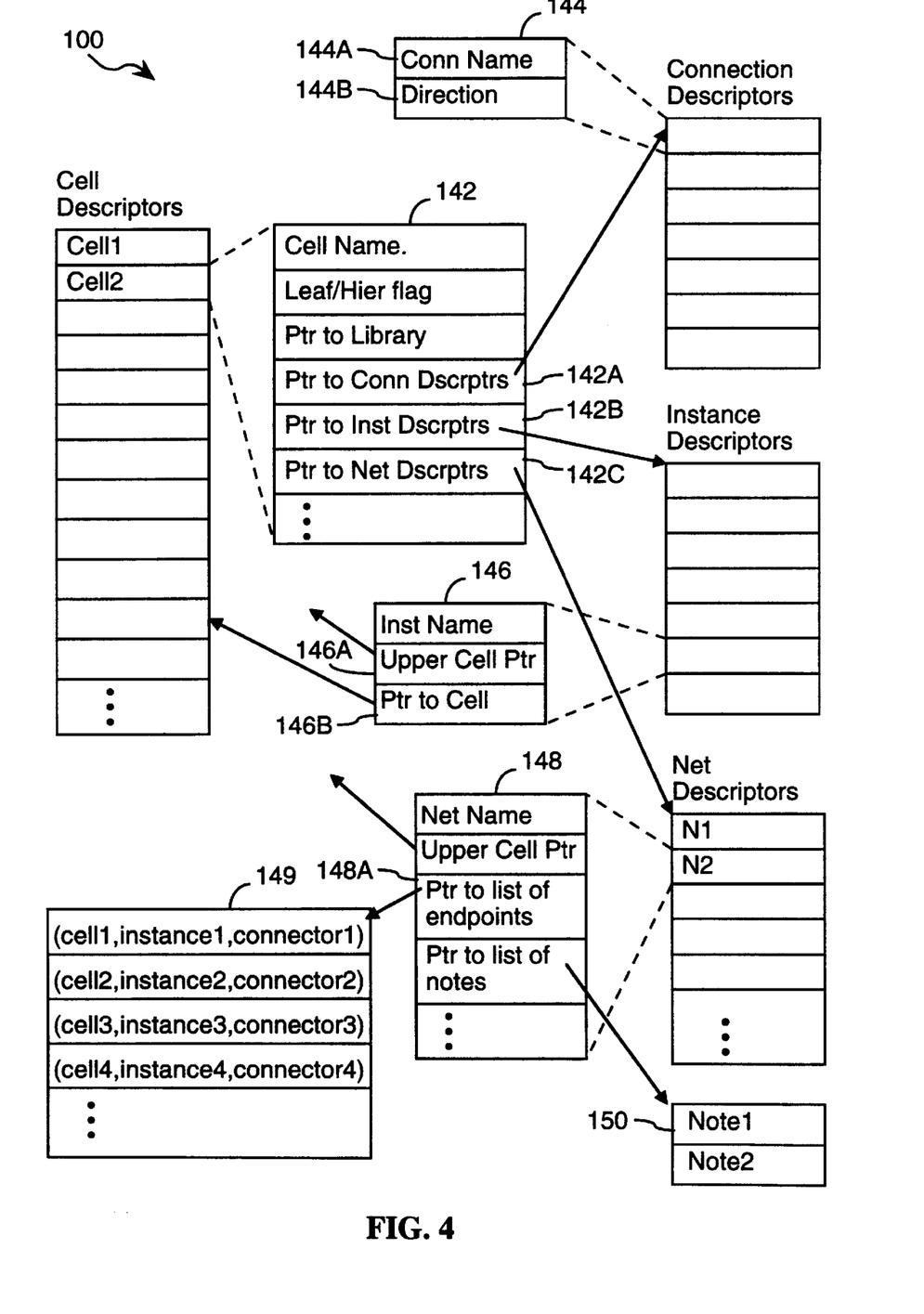
FIG. 4 depicts data structures used to store a hierarchical view of a circuit design.

Referring to FIG. 4, a circuit design is typically stored in a computer memory using the following descriptors:

1) Connectors 144. A connector is a descriptor that symbolizes a point by which a signal is communicated between a cell and the interconnection. It is composed of a name 144A and a direction 144B. The direction can be an input, an output or bidirectional.

2) Cells 142. A cell is a descriptor that symbolizes a given functionality. It has a pointer 142A to its connector descriptors. There are two types of cells: hierarchical cells and leaf cells. Leaf cells have a pointer to the library where their functionality is defined. If a leaf cell has no such point, then it is considered to be a "black-box," which means that it is a leaf cell with unknown functionality. Each hierarchical cell has a pointer 142B to a set of Instance descriptors and another pointer 142C to a set of Net descriptors 148. Instance and Net descriptors are collectively called Functional Descriptors. Those descriptors actually define a hierarchical cell's functionality. A hierarchical cell is referenced by its functional descriptors (see pointer 146A) as the parent cell or upper cell relative to those components of the hierarchical cell.

3) Instances 146. An instance is a descriptor that symbolizes an occurrence of a cell (referenced by pointer 146B) in a specified circuit design. Indeed, the same cell can have several occurrences of itself in a design. Each of these different occurrences are given a different descriptor that is called an Instance. Each instance has a pointer 146B to the cell of which it is an instance. When the instance is a part of a hierarchical cell, it also has a pointer 146A to the instance cell's parent cell (i.e, the hierarchical cell of which it is a part).

4) Nets 148. A net is a descriptor that symbolizes an interconnection (or the portion of an interconnection found within a particular hierarchical cell). It has a pointer 148A to a list 149 of (cell, instance, connector) triplets (called the interconnection endpoints) that define the interconnection endpoints. Note that the triplets can only refer to instances within the same functional descriptor set. When a triplet refers to the upper cell (i.e., the parent of the cell in which the net resides), the instance descriptor pointer in the triplet is a void pointer (i.e., the pointer value is "null"). Such an endpoint in the list 149 means that the net is a portion of the interconnection and that the other portions are connected to the same connector of the instance of the upper cell. Of course, the root cell of the circuit design (which is also called the topmost cell) has no instance of itself in the circuit design.

The circuit representation data structures 140 will typically also include additional data structures, such as data structures for storing notes 150 that can be attached to circuit components such as nets and cells through the use of corresponding pointers.

Figure 2A:
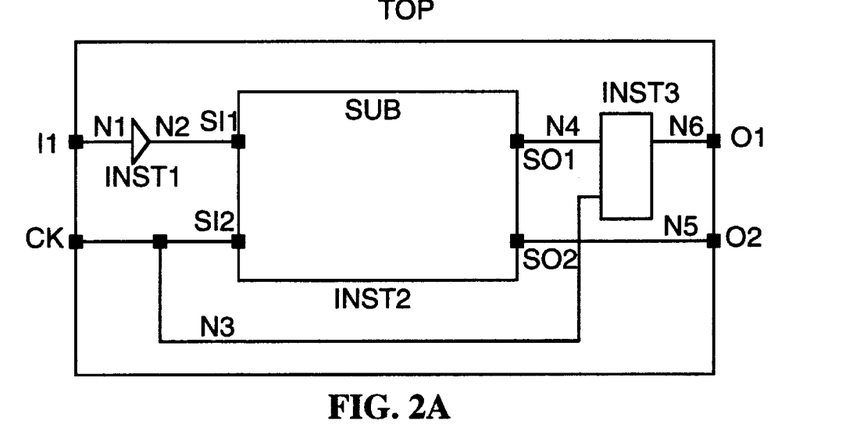
FIGS. 2A and 2B represent a hierarchical view of a circuit design.
Figure 2B:
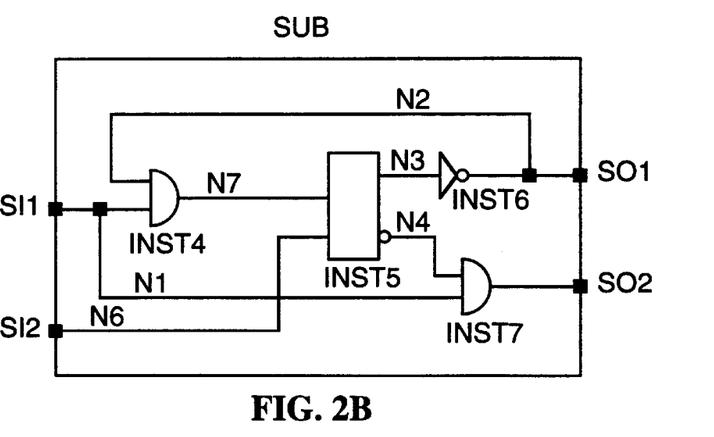

An example of a hierarchical circuit is shown in FIGS. 2A and 2B. In the circuit shown there is a top level hierarchical cell labeled TOP, with connectors (I1, CK, O1, O2), and its functional descriptors. The functional descriptors for TOP include functional descriptors for instances INST1, INST2, INST3 and for Nets N1,N2, N3, N4, N5, N6. As an example, Net N1 is represented by 2 triplets: (TOP, <NULL>,I1) and (BUFFER,INST1,I). INST2 is an instance of the hierarchical cell SUB. The connectors for INST2 are SI1, SI2, SO1, SO2, and the functional descriptors for INST2 are instances INST4, INST5, INST6, INST7 and Nets N1, N2, N3, N4, N5, N6, N7.

The overall circuit design is the top level hierarchical cell. The hierarchical view of a circuit design generally contains instances of hierarchical cells. In such a view, an interconnection is represented by a different net descriptor in each hierarchical cell in which it is included. For example, in FIGS. 2A and 2B, the net N3 in hierarchical cell TOP and the net N6 in hierarchical cell SUB are two descriptors of the same interconnection. Locating all the leaf cells connected to an interconnection requires utilization of those descriptors.

A drawback of the hierarchical view of a circuit design is that the circuit design information is partitioned into different functional descriptor sets. As a result, access to the circuit design information is relatively slow.

Figure 3:
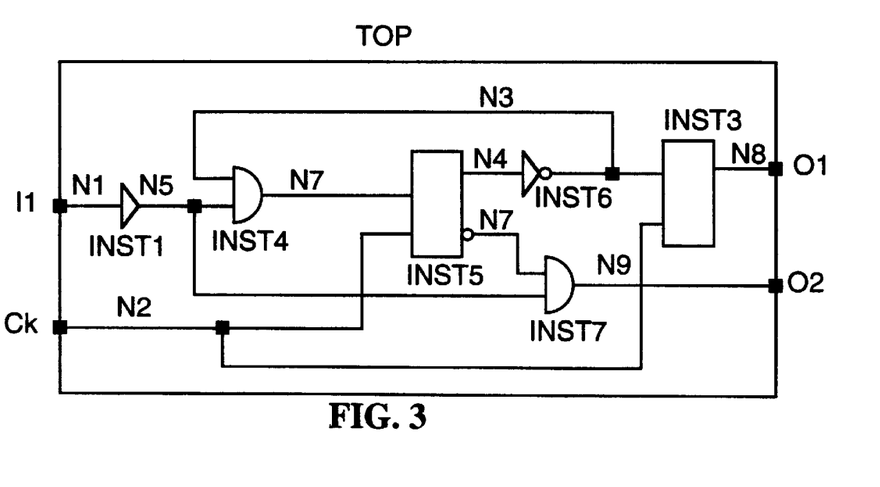
FIG. 3 represents a flat view of the circuit design shown in FIGS. 2A and 2B.

The flat view of a circuit design does not contain any instances of hierarchical cells. In the flat view of a circuit design, each interconnection is represented by one unique descriptor since there is no hierarchical cell instance. As a result, all the leaf gates connected to a net can be found directly in the associated descriptor. FIG. 3 represents a flat view of the circuit design shown in FIGS. 2A and 2B.

In the present invention, a flat view of a circuit design is superimposed on the circuit design's hierarchical view by using flat nets 152. This will be explained in more detail next.

Overview of Method of Using Flat Nets

Figure 5:
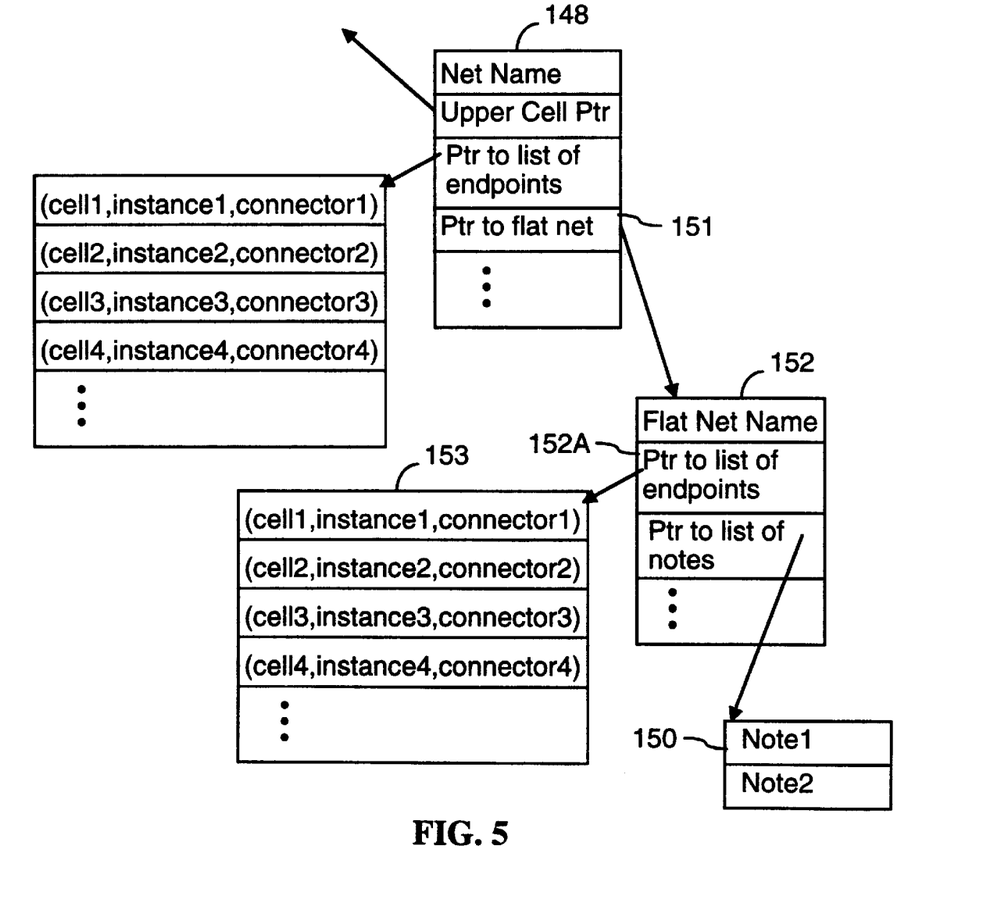
FIG. 5 depicts data structures used to store a flat view of a circuit design.

In accordance with the present invention, a hierarchical view of a circuit design is generated and stored in a computer memory, and then a new descriptor is associated with each interconnection. In this document the added descriptor is called the Flat Net descriptor 152. Referring to FIGS. 4 and 5, a pointer 151 to the unique flat net descriptor is added to each net descriptor 148 of an interconnection. The flat net descriptor 152 has a pointer 152A to a list 153 of triplets (cell, instance, connector). These triplets have two characteristics that differentiate them from the nets:

The instances pointed to by the instance pointer in each triplet can be located in any functional descriptor set. It is for this reason that a single Flat Net descriptor represents all the endpoints of a particular interconnection.

The only hierarchical cell that can be pointed to by the triplets is the top level cell. The other hierarchical cells are ignored since they do not exist when the circuit design is viewed as flat.

Process for Adding Flat Nets to a Hierarchical Circuit Description

Figure 6:
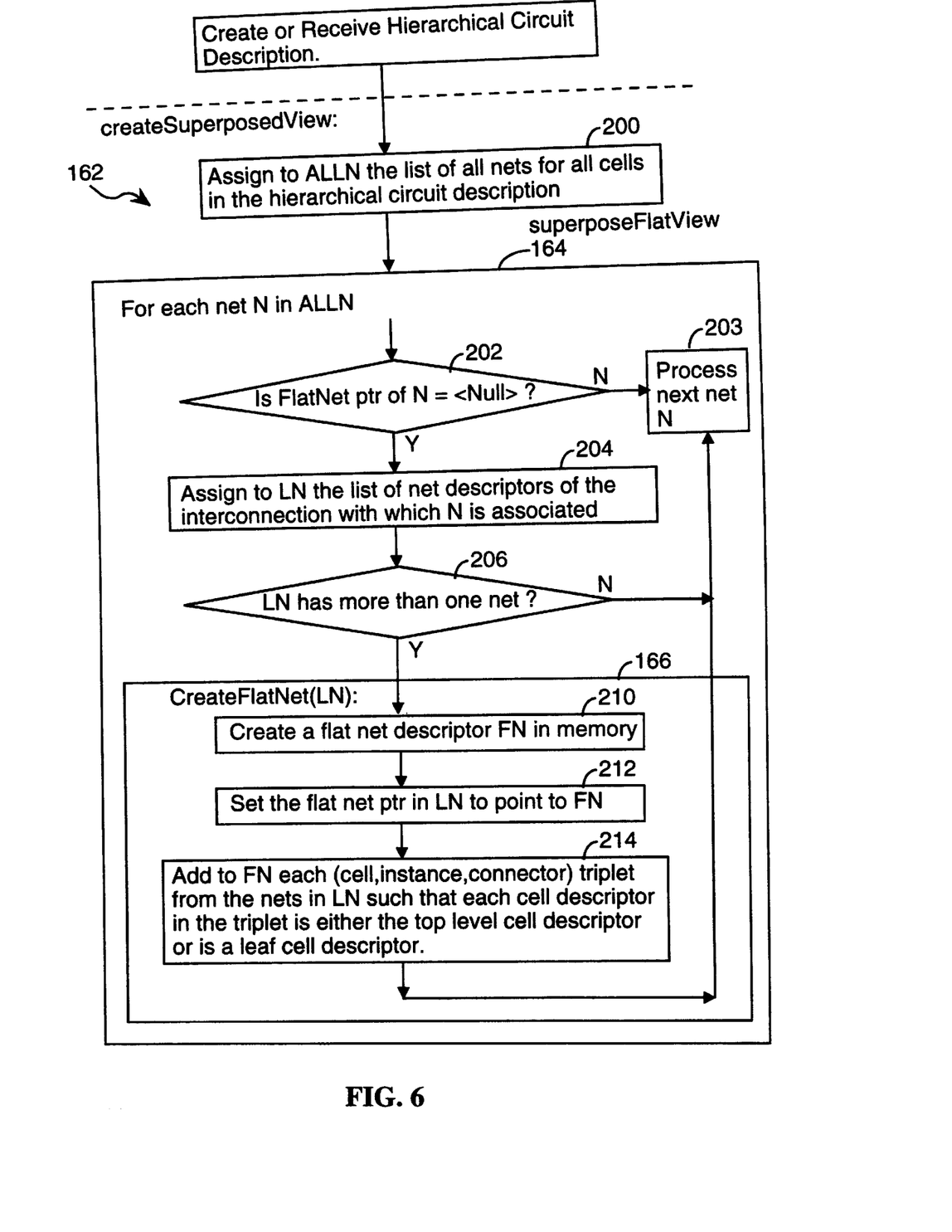
FIG. 6 is a flow chart of a procedure for adding a flat net representation to a hierarchical representation of a circuit design.

Referring to FIG. 6 (and the data structures referenced in FIGS. 4 and 5), the process begins by building the hierarchical view of a circuit design, using conventional techniques. The process then utilizes operators herein called create Superposed View 162, removeSuperposedView 168, accessFlatNet 170, and modifyDesign 172, 174. It is assumed here that the operator for creating the hierarchical circuit description, which might be called, "createHierarchicalView" exists and has already been invoked. As part of this process, each net descriptor 148 in the hierarchical representation of the specified circuit is created with an associated flat net descriptor pointer 151 that is initially assigned a value of <NULL>.

OPERATOR createSuperposedView: The steps of the createSuperposedView procedure 162 invoked by this operator are:

1) assign to ALLN the list of all the nets found in the functional descriptors of all hierarchical cells in a specified circuit design (step 200);

2) run superposeFlatView(ALLN) 164.

The steps of the superposeFlatView(ALLN) procedure 164 are:

1) for each net N in ALLN do steps 2, 3, 4;

2) if the flat net pointer of N is not equal to <NULL> (step 202) then start next iteration (go to step 1) (step 203);

3) assign to LN the list of net descriptors of the interconnection with which N is associated (step 204); (in other words, for every hierarchical cell endpoint of net N having an instance field that is <NULL>, add to LN the net connected to the same connector of the instance of the hierarchical cell, and for every hierarchical cell endpoint of net N having an instance field that is not <NULL>, add to LN the net connected to the same connector of the hierarchical cell among its functional net descriptors. Repeat this procedure for all nets in LN until all the nets that form a single signal line have been identified and added to LN);

4) run the createFlatNet(LN) procedure 166.

The createFlatNet(LN) procedure performs the following steps:

1) create a flat net descriptor FN (step 210);

2) set the flat net pointer in each net descriptor in LN to point to FN (step 212);

3) add to FN each (cell, instance, connector) triplet from the nets in LN such that the cell descriptor in each triplet is either the top level cell descriptor or is a leaf cell descriptor (step 214). Endpoints that are not connected to either top level cell input/output points or leaf cell connection points (e.g., hierarchical cell net endpoints) are not added to FN.

In order to improve memory usage it is possible to change step 4 of the superposeFlatView(ALLN) procedure to:

4) if the list LN has more than one net (step 206), then run the createFlatNet(LN) procedure.

Indeed, a net that has no hierarchical cell endpoint is the unique descriptor of its interconnection, and the flat net descriptor is useless.

The process described above is limited to designs where the hierarchical cells have only one instance of themselves. If this is not the case, it is possible to change the design to make this assumption true by replacing each instance of the hierarchical cells that have several instances of themselves with an instance of a copy of the corresponding hierarchical cell.

The "removeSuperposedView" procedure performs the steps of:

1) assign to ALLN the list of all the nets found in the functional descriptors of all hierarchical cells (step 220);

2) for each N in ALLN, assign <NULL> to the flat net pointer of N (step 222);

3) delete each flat net from memory (step 224).

Once the flat nets are superposed on the hierarchical description of a specified circuit, other procedures (herein collectively called the AccessNet and AccessFlat procedures, respectively) can either access the net descriptors 148 for the circuit in order to utilize the hierarchical boundaries of the circuit design, or can access the flat net descriptors 152 to utilize only the gates and interconnects of the circuit design. It is possible to access the flat net descriptors 152 through the net descriptors 148, since each net descriptor 148 has a pointer 151 to the corresponding flat net descriptor 152.

Examples of procedures that access the flat net description of a circuit include:

FindTripletAtIndex(FlatNet, index), a procedure that identifies the (cell, instance, connector) triplets of the flat net.

HookMyDataOnFlatNet(FlatNet, MyData), a procedure that hooks a "note" 150 containing the information in "MyData" to the flat net.

GetMyDataFromFlatNet(FlatNet), a procedure that retrieves the information in one or more notes 150 previously hooked on the specified flat net.

Modifying a Circuit Design

Prior to removing a hierarchical cell from a circuit design, one must first remove all the functional items which are associated with it, and one must also remove the instances of this cell in the circuit design. Prior to removing an instance, one must remove it from all the interconnections that have an endpoint on it. In addition, prior to removing an interconnection, one must first remove all its endpoints.

Once an instance is not an endpoint of any interconnection, it can be removed without any influence on the superposed hierarchical and flat views of the circuit design. As a result, the basic operations to modify the netlist of a circuit design are:

connect an interconnection to a new endpoint (i.e., add one triplet in a net descriptor); and disconnect an interconnection from an endpoint (i.e., remove one triplet in a net descriptor).

The procedure for keeping the superposed view up to date when a new endpoint is added is:

1) assign to ALLN1 the list of net descriptors (if any) associated with the interconnection already connected to the new triplet;

2) remove the flat net descriptor (i.e., delete it from memory) of the interconnection associated with ALLN1;

3) assign to ALLN2 the list of net descriptors of the considered interconnection (i.e., the one to which a new endpoint is being added);

4) remove the flat net descriptor of the considered interconnection;

5) assign to ALLN the concatenation of ALLN1 and ALLN2;

6) set the flat net pointer of each net in ALLN to <NULL>;

7) apply the modification to the hierarchical design;

8) run the "superposeFlatView(ALLN)" procedure.

The procedure for keeping the superposed view up to date when an endpoint is removed from an interconnection is:

1) assign to ALLN the list of net descriptors of the considered interconnection (i.e., the one from which an endpoint is being removed);

2) remove the flat net descriptor of the considered interconnection;

3) set the flat net pointer of each net in ALLN to <NULL>;

4) apply the modification to the hierarchical design;

5) run the "superposeFlatView(ALLN)" procedure. If the removal of an endpoint splits the considered interconnection into two separate interconnections, which will often be the case, then running superposeFlatView (ALLN) will create two new flat nets.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of adding a set of flat net descriptors to a hierarchical representation of a specified circuit design, said hierarchical representation including a set of cell descriptors representing hierarchical cells in the specified circuit design, a set of net descriptors representing portions of interconnections located within each said hierarchical cell, each net descriptor having associated therewith a list of endpoint descriptors representing endpoints of a corresponding one of said interconnections located within a respective hierarchical cell; said method comprising the steps of:

(A) generating for each interconnection in said specified circuit a flat net descriptor having associated therewith a list of endpoint descriptors representing all endpoints of said interconnection, each of said endpoint descriptors representing an interconnection endpoint in a flat, top level circuit representation of said specified circuit design; and (B) adding to each said net descriptor in the hierarchical representation of the specified circuit design a flat net pointer to an associated one of said flat net descriptors, such that a flat net representation of any interconnection in said specified circuit design is accessible through said flat net pointer in each of the net descriptors representing said interconnection.

2. A method of adding a set of flat net descriptors to a hierarchical representation of a specified circuit design, said hierarchical representation including a set of cell descriptors representing hierarchical cells in the specified circuit design, a set of net descriptors representing portions of interconnections located within each said hierarchical cell, each net descriptor having associated therewith a list of endpoint descriptors representing endpoints of a corresponding one of said interconnections located within a respective hierarchical cell; said method comprising the steps of:

(A) generating a list, ALLN, of all net descriptors in the hierarchical representation of the specified circuit design;

(B) for each net descriptor N in ALLN, associating a flat net pointer with the net descriptor N and setting said flat net pointer's initially to a null value; and (C) for each net descriptor N in ALLN whose flat net pointer is equal to said null value, performing the steps of:

(C1) generating a list, LN, of all net descriptors in the hierarchical representation of the specified circuit design that comprise a same electrical interconnection in the specified circuit design;

(C2) generating a flat net descriptor, FN;

(C3) setting the flat net pointer of each net in LN to point to said generated flat net descriptor FN; and (C4) adding to said generated flat net descriptor FN a flat net representation of all connection endpoints associated with each of said net descriptors in said list LN.

3. The method of claim 2, (D) modifying said circuit design so as to remove a specified endpoint from a specified one of said interconnections, by:

(D1) generating a list, ALLN, of all of said net descriptors that represent said specified one interconnection;

(D2) deleting the flat net descriptor associated with said specified one interconnection;

(D3) setting the flat net pointer of each net descriptor in ALLN to said null value;

(D4) modifying said hierarchical representation of said circuit design by removing an endpoint descriptor associated with said specified endpoint from the list of endpoints associated with a respective one of said net descriptors representing said specified one interconnection;

(D5) performing steps A and C so as to generate one or more flat net descriptors for the net descriptors associated with said specified one interconnection.

4. The method of claim 2, (E) modifying said circuit design so as to add a specified endpoint to one of said interconnections, by:

(E1) generating one or more lists that together represent all of said net descriptors that represent a first interconnection to which said specified endpoint is (E2) deleting the flat net descriptor associated with said first interconnection and the flat net descriptor associated with said specified one interconnection;

(E3) setting the flat net pointer of each net descriptor represented in said generated one or more lists to said null value;

(E4) modifying said hierarchical representation of said circuit design by adding an endpoint descriptor associated with said specified endpoint to the list of endpoints associated with a respective one of the net descriptors representing said specified one interconnection;

(E5) performing steps A and C so as to generate a flat net descriptor for the net descriptors associated with said specified one interconnection.

5. A computer program product, for use in conjunction with a computer system, the computer program product comprising a computer readable storage medium and a computer program mechanism embedded therein, the computer program mechanism comprising:

data structures for storing a hierarchical representation of a specified circuit design, said hierarchical representation including a set of cell descriptors representing hierarchical cells in the specified circuit design, a set of net descriptors representing portions of interconnections located within each said hierarchical cell, each net descriptor having associated therewith a list of endpoint descriptors representing endpoints of a corresponding one of said interconnections located within a respective hierarchical cell;

a flat net generation module for generating for each interconnection in said specified circuit a flat net descriptor having associated therewith a list of endpoint descriptors representing all endpoints of said interconnection, each of said endpoint descriptors representing an interconnection endpoint in a flat, top level circuit representation of said specified circuit design; and said flat net generation module including instructions for adding to each said net descriptor in the hierarchical representation of the specified circuit design a flat net pointer to an associated one of said flat net descriptors, such that a flat net representation of any interconnection in said specified circuit design is accessible through said flat net pointer in each of the net descriptors representing said interconnection.

6. A computer program product for use in conjunction with a computer system, the computer program product comprising a computer readable storage medium and a computer program mechanism embedded therein, the computer program mechanism comprising:

data structures for storing a hierarchical representation of a specified circuit design, said hierarchical representation including a set of cell descriptors representing hierarchical cells in the specified circuit design, a set of net descriptors representing portions of interconnections located within each said hierarchical cell, each net descriptor having associated therewith a list of endpoint descriptors representing endpoints of a corresponding one of said interconnections located within a respective hierarchical cell;

a flat net generation module for generating for each interconnection in said specified circuit a flat net descriptor having associated therewith a list of endpoint descriptors representing all endpoints of said interconnection, each of said endpoint descriptors representing an interconnection endpoint in a flat, top level circuit representation of said specified circuit design; and said flat net generation module including instructions for
(A) generating a list, ALLN, of all net descriptors in the hierarchical representation of the specified circuit design;
(B) for each net descriptor N in ALLN, associating a flat net pointer with the net descriptor N and setting said flat net pointer's initially to a null value; and
(C) for each net descriptor N in ALLN whose flat net pointer is equal to said null value, performing the steps of:
(C1) generating a list, LN, of all net descriptors in the hierarchical representation of the specified circuit design that comprise a same electrical interconnection in the specified circuit design;
(C2) generating a flat net descriptor, FN;
(C3) setting the flat net pointer of each net in LN to point to said generated flat net descriptor FN; and
(C4) adding to said generated flat net descriptor FN a flat net representation of all connection endpoints associated with each of said net descriptors in said list LN.

7. The computer program product of claim 6, further including a circuit design modification module, said circuit design modification module including instructions for:
(D) modifying said circuit design so as to remove a specified endpoint from a specified one of said interconnections, by:
(D1) generating a list, ALLN, of all of said net descriptors that represent said specified one interconnection;
(D2) deleting the flat net descriptor associated with said specified one interconnection;
(D3) setting the flat net pointer of each net descriptor in ALLN to said null value;
(D4) modifying said hierarchical representation of said circuit design by removing an endpoint descriptor associated with said specified endpoint from the list of endpoints associated with a respective one of said net descriptors representing said specified one interconnection;
(D5) executing instructions A and C so as to generate one or more flat net descriptors for the net descriptors associated with said specified one interconnection.

8. The computer program product of claim 6, further including a circuit design modification module, said circuit design modification module including instructions for:
(E) modifying said circuit design so as to add a specified endpoint to one of said interconnections, by:
(E1) generating one or more lists that together represent all of said net descriptors that represent a first interconnection to which said specified endpoint is connected and all of said net descriptors that represent said specified one interconnection;
(E2) deleting the flat net descriptor associated with said first interconnection and the flat net descriptor associated with said specified one interconnection;
(E3) setting the flat net pointer of each net descriptor represented in said generated one or more lists to said null value;
(E4) modifying said hierarchical representation of said circuit design by adding an endpoint descriptor associated with said specified endpoint to the list of endpoints associated with a respective one of the net descriptors representing said specified one interconnection;
(E5) executing instructions A and C so as to generate a flat net descriptor for the net descriptors associated with said specified one interconnection.

\* \* \* \* \*